(12) United States Patent
Pulvirenti

(10) Patent No.: US 6,362,697 B1
(45) Date of Patent: Mar. 26, 2002

(54) LOW SUPPLY VOLTAGE RELAXATION OSCILLATOR HAVING CURRENT MIRROR TRANSISTORS SUPPLY FOR CAPACITORS

(75) Inventor: Francesco Pulvirenti, Acireale (IT)

(73) Assignee: STMicroelectronics S.r.L., Agrate Brianza (IT)

(*) Notice: Subject to any disclaimer, the term of this patent is extended or adjusted under 35 U.S.C. 154(b) by 0 days.

(21) Appl. No.: 09/561,425

(22) Filed: Apr. 28, 2000

(30) Foreign Application Priority Data

Apr. 30, 1999 (EP) .................................... 99830260

(51) Int. Cl.[7] .................................................. H03B 5/24
(52) U.S. Cl. ...................................... 331/111; 331/143
(58) Field of Search ............................ 331/111, 113 R, 331/143–145

(56) References Cited

U.S. PATENT DOCUMENTS

| | | | |
|---|---|---|---|
| 4,066,982 A | | 1/1978 | Strohl .......................... 331/111 |
| 4,623,851 A | | 11/1986 | Abou .......................... 331/111 |
| 5,153,534 A | * | 10/1992 | Ruetz .......................... 331/111 |
| 5,699,024 A | | 12/1997 | Manlove et al. ............. 331/111 |
| 5,710,527 A | * | 1/1998 | Yaguchi et al. ................ 331/57 |
| 5,760,655 A | * | 6/1998 | Roohparvar .................. 331/111 |
| 5,990,753 A | * | 11/1999 | Danstrom et al. ........... 331/143 |
| 6,020,792 A | * | 2/2000 | Nolan et al. ................. 331/111 |
| 6,052,035 A | * | 4/2000 | Nolan et al. ................... 331/74 |
| 6,107,894 A | * | 8/2000 | Van Tuijl et al. ........... 331/143 |
| 6,147,566 A | * | 11/2000 | Pizzuto et al. .............. 331/111 |
| 6,157,265 A | * | 12/2000 | Hanjani ........................ 331/49 |
| 6,157,270 A | * | 12/2000 | Tso ............................. 331/176 |

FOREIGN PATENT DOCUMENTS

EP          0 813 303 A1       12/1997

* cited by examiner

*Primary Examiner*—David Mis
(74) *Attorney, Agent, or Firm*—Lisa K. Jorgenson; Robert Iannucci; Seed IP Law Group PLLC

(57) ABSTRACT

Presented is a low supply voltage oscillator circuit having at least one capacitor to be controlled, connected between first and second voltage references, and a circuit for charging and discharging the capacitor to be controlled. The oscillator circuit also includes at least first and second stages having symmetrical structures in a mirror-image configuration and being connected between the first voltage reference and the second voltage reference and connected together through a memory element. The oscillator circuit also includes respective primary switches for alternately charging the capacitors in a controlled fashion.

17 Claims, 4 Drawing Sheets

LOW SUPPLY VOLTAGE RELAXATION OSCILLATOR HAVING CURRENT MIRROR TRANSISTORS SUPPLY FOR CAPACITORS

TECHNICAL FIELD

This invention relates to a low supply voltage oscillator circuit, and, more specifically, this invention relates to a circuit that can generate an oscillating signal that is independent of the supply voltage, temperature of operation and the process used to create the circuit, and can work with a low supply voltage.

BACKGROUND OF THE INVENTION

Oscillator circuits are widely used in analog and digital circuits. They can be employed in a large number of applications, such as for driving a voltage multiplier, or generating a clock frequency or a programmable delay.

A good oscillator is usually expected to be operable at a high switching frequency and to have an oscillation frequency independent of the supply voltage, process variations, and temperature. It is also expected to have a duty cycle which can be defined for a constant ratio, and to exhibit low electromagnetic interference (EMI), that is, primarily voltages edges with controlled slopes of moderate steepness.

In recent years, there has been an increased demand for devices capable of operating on lower supply voltages, e.g., for cellular telephone and computer applications, and increased demand for more efficient performance, e.g., for the processing of signals in a synchronous state machine, which must be managed at a very high clock frequency.

A very simple oscillator circuit 1 is shown in FIG. 1. It is formed by connecting into a loop two inverters INV1', INV2', a resistor R0, and a capacitor C0, and generates an oscillating electric signal of substantially square shape.

The oscillator circuit 1 has the following frequency of oscillation:

$$f_0 = \frac{1}{R_0 C_0 \cdot \left[\ln\left(\frac{V_S + V_{TH}}{V_{TH}}\right) + \ln\left(\frac{V_S + V_{TH}}{V_S - V_{TH}}\right)\right]} \quad (1)$$

where, $V_S$ is the supply voltage to the oscillator circuit 1; and $V_{TH}$ is the switching voltage threshold of the inverters INV1' and INV2'.

This simple circuit fails, however, to meet the aforementioned requirements. In particular:

the oscillation frequency is dependent on the switching voltage threshold of the inverters: its value reaches a maximum when the switching voltage threshold of the inverters is one half the supply voltage;

the duty cycle of the oscillator circuit 1 also is dependent on the switching voltage threshold of the inverters: its value is 50% when the switching voltage threshold of the inverters is one half the supply voltage; and the voltage at the input of the first inverter INV1' has larger variations than the circuit supply voltage: its value varies between $V_{TH}+V_S$ and $V_{TH}-V_S$.

From an article by S. Hobrecht, "An Intelligent BiCMOS/ DMOS Quad 1-A High-Side Switch", IEEE Journal of Solid-State Circuits, Vol. 25, No. 6, Dec. 1990, especially from FIG. 4 and its description on page 1397, a more sophisticated oscillator circuit 2 is known, as shown schematically in FIG. 2.

The oscillator circuit 2 includes a first inverter INV1 and a second inverter INV2 which are cascade connected to each other and connected to an output terminal OUT of the oscillator circuit 2, and two similar symmetrical sections connected to form a double feedback loop between the input terminal of the first inverter INV1 and the output terminal OUT of the oscillator circuit 2.

A first of the sections includes a first transistor SW1 of the P-channel MOS type and a first current generator GEN1, which are connected in series with each other between a supply terminal VDD and a ground voltage reference GND. In addition, the first transistor SW1 has a control terminal connected to the output terminal OUT.

The first section also includes a first capacitor C1 connected in parallel with the first current generator GEN1 and connected to the ground reference GND, and includes a first controlled switch SW3 which is connected between the first capacitor C1 and the input terminal of the first inverter INV1.

To provide for the circuit feedback, the control terminal of the first controlled switch SW3 is connected to an interconnection node X between the first INV1 and second INV2 inverters.

Likewise, the oscillator circuit 2 includes a second section, which in turn includes a second capacitor C2 having first and second terminals, a second current generator GEN2 having an input terminal and an output terminal, a second transistor SW2 of the N-channel MOS type, and a second controlled switch SW4, in a circuit configuration which is similar to that just described for the first section.

Where the two capacitors C1 and C2 have the same capacitance Co and the generators GEN1 and GEN2 have the same current value Io, the oscillation frequency of the oscillator circuit 2 will be:

$$f_0 = \frac{Io}{V_S \cdot Co} \quad (2)$$

Thus, the oscillator circuit 2 is not affected by the problems brought about by dependence of the oscillation frequency on the switching voltage threshold of the inverters, and on a varying input voltage to the first inverter.

However, not even this solution is entirely devoid of drawbacks. In particular:

the oscillation frequency is dependent on the supply voltage VDD;

the duty cycle is dependent on the switching voltage threshold of the inverters; and the oscillation frequency and duty cycle are both affected by any asymmetry existing between the current generators GEN1 and GEN2, since they are formed in practice by P-channel and N-channel transistors.

A further approach is described in European Patent No. 0 735 677 to this Applicant, herein incorporated by reference, wherein, as shown schematically in FIG. 3, a single capacitor C is used which is charged and discharged by two current generators (Gen1, Gen2 ) having first and second values, such that the voltage across the capacitor C will follow a triangular pattern and have an amplitude which corresponds substantially to the ratio of the product of the two values and their sum.

In particular, the oscillator circuit 3 includes a capacitor C, charge circuitry CCA, and control circuitry CCO.

The charge circuitry CCA includes the first and second current generators, GEN1 and GEN2, which generate two current values with opposite signs to deliver current at the output of the circuitry CCA and absorb it. It also includes a switch means, represented by first SW1 and second SW2 switches operative to alternately couple the generators GEN1, GEN2 to the capacitor C.

The control circuitry CCO has a voltage input coupled to the capacitor C and an output coupled to control inputs of the switches SW1, SW2, and includes a comparator with hysteresis.

An oscillating signal appears at several points of the oscillator circuit 3 which can be utilized to output, for example, the voltage across the capacitor C. However, it is convenient to have the circuit output OUT connected to the output of the comparator with hysteresis, that is, to the output of the circuitry CCO, so that a substantially square wave-like form can be obtained. This square wave normally needs no buffering because the output of a comparator has relatively low impedance.

The circuitry CCO has an input and an output, and includes two comparators COMP1, COMP2, an inverter COMP3, two controlled switches SW3, SW4, and first and second voltage generators VTH and VTL.

The oscillator circuit 3 has essentially two operational conditions: a first condition which corresponds to the capacitor C being injected the current from the generator GEN1, and a second condition which corresponds to the capacitor C being extracted the current drawn by the generator GEN2.

The circuitry CCO is adapted to alternatively activate the first or the second operational condition according to whether the voltage across the capacitor C has dropped below the lower threshold or exceeded the upper threshold.

The oscillation frequency of the oscillator circuit 3 is substantially:

$$f_0 = \frac{1}{R_0 C_0} \quad (3)$$

Thus, the oscillation frequency and duty cycle of the oscillator circuit 3 are dissociated from the supply voltage, the temperature and the process.

Although in many ways advantageous, this approach cannot be used in low supply voltage applications.

SUMMARY OF THE INVENTION

Embodiments of this invention provide an oscillator circuit suitable for low supply voltage applications which has such structural and functional features as to overcome the drawbacks that still beset prior art devices.

Specifically, these embodiments relate to a low supply voltage oscillator circuit that has at least one capacitor to be controlled, connected between first and second voltage references, and a circuit for charging and discharging the controlled capacitor. The oscillator can be formed with CMOS technology, for instance.

One embodiment of the invention includes two capacitors being charged alternately in a controlled fashion with the intermediary of a memory device, such as a bistable device or an SR flip-flop.

The features and advantages of an oscillator circuit according to the invention will be more clearly understood from the following description of an embodiment thereof, given by way of non-limitative example with reference to the accompanying drawings.

DETAILED DESCRIPTION OF THE INVENTION

Figure 1:
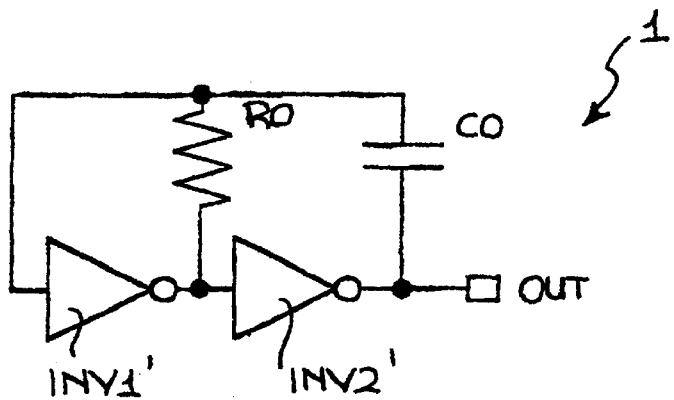
FIG. 1 is a schematic diagram of a first example of a prior art oscillator circuit.
Figure 2:
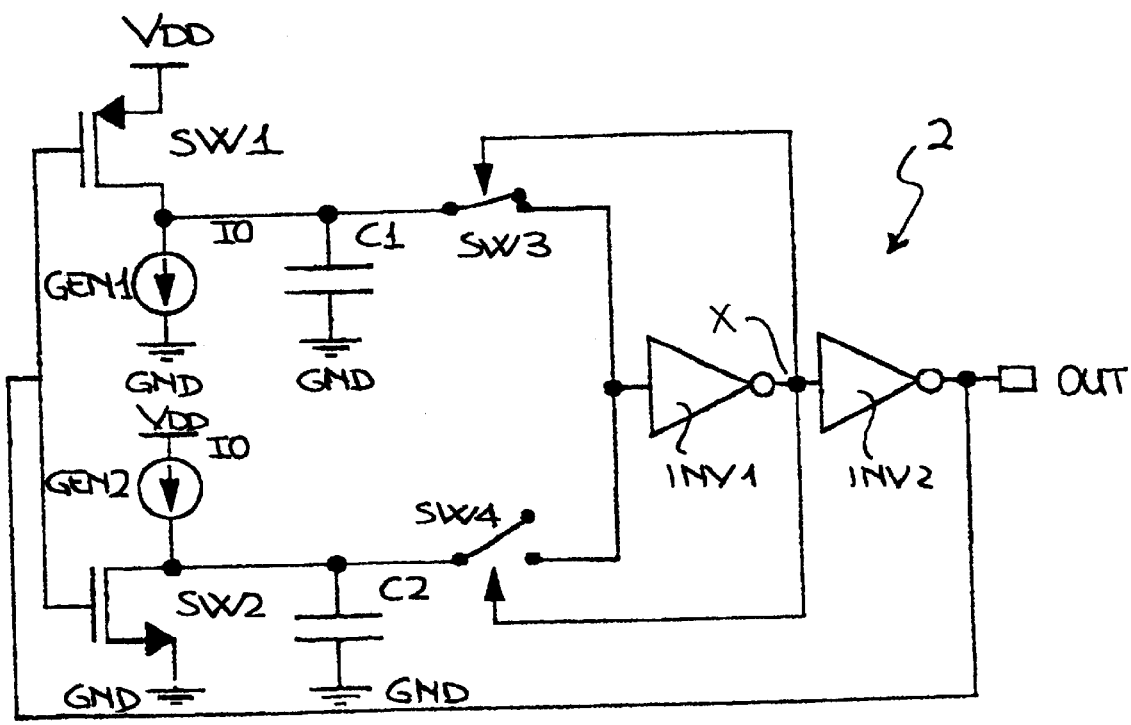
FIG. 2 is a schematic diagram of a second example of a prior art oscillator circuit.
Figure 3:
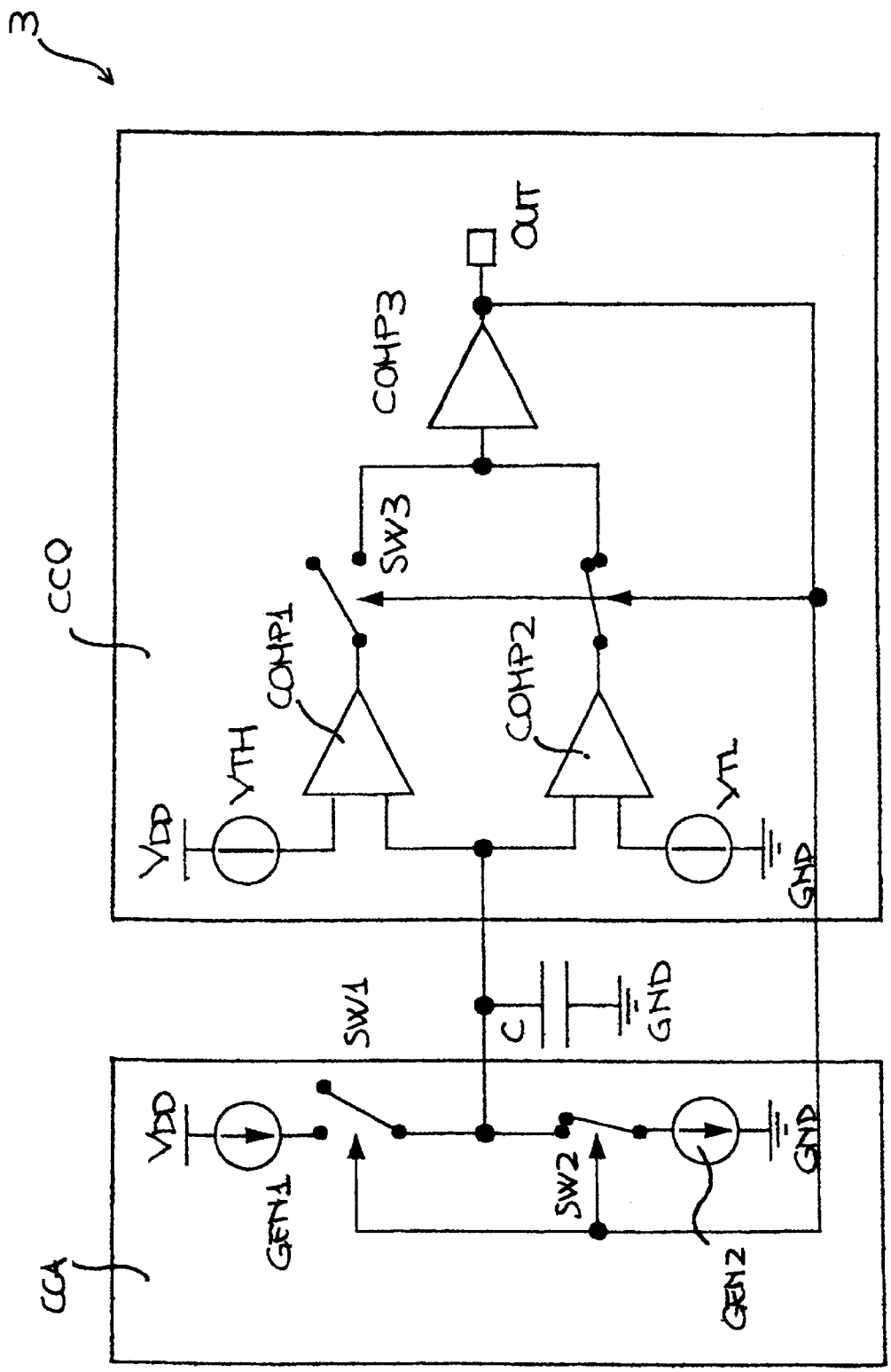
FIG. 3 is a schematic diagram of a third example of a prior art oscillator circuit.
Figure 4:
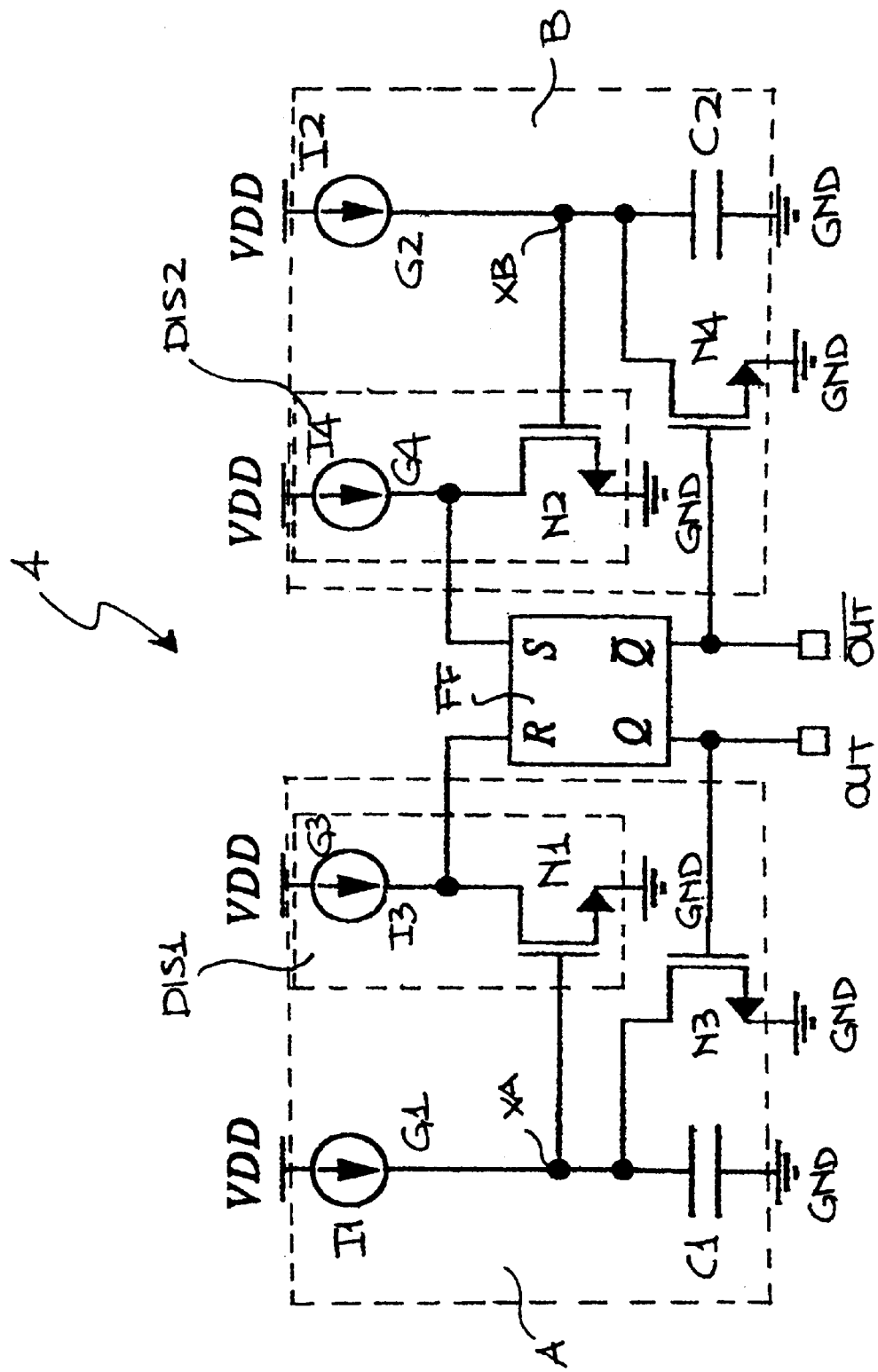
FIG. 4 is a schematic diagram of an oscillator circuit according to a first embodiment of the invention.

Referring to the drawing views, particularly to FIG. 4, shown generally and schematically at 4 is a low supply voltage oscillator circuit according to an embodiment of the invention.

The oscillator circuit 4 has a symmetrical structure comprising two stages A, B in a mirror-image configuration.

Advantageously in this embodiment, the oscillator circuit 4 includes a memory element FF connecting the first A and second B stages together. This memory element FF can be, for instance, a bistable device or flip-flop having a first input terminal R connected to the first stage A, a second input terminal S connected to the second stage B, a first output terminal Q connected to the first output terminal OUT of the oscillator circuit 4, and a second output terminal $\overline{Q}$ connected to a second output terminal $\overline{OUT}$ of the oscillator circuit 4.

The first stage A includes a capacitor C1 to be controlled, which is connected to a supply reference VDD through a charge current generator G1, and connected to a ground reference GND. It also includes an additional switch N3 which is connected between an interconnection node XA and the ground reference GND. The interconnection node XA is defined between the capacitor C1 to be controlled and the charge current generator G1. The switch N3 has a control terminal connected to the first output terminal Q of the flip-flop FF.

The first stage A further includes a decoupling block DIS1 connected between the supply reference VDD and ground GND, and connected to the interconnection node XA and the first input terminal R of the flip-flop FF.

In particular, the decoupling node DIS1 includes a switch N1 and a control current generator G3, which are connected in series with each other between the supply terminal VDD and ground GND, said switch N1 having its control terminal connected to the interconnection node XA.

Likewise, the second stage B includes a capacitor C2 to be controlled and a charge current generator G2, and includes an additional switch N4 which is connected between an interconnection node XB and the ground reference GND. The interconnection node XB is defined between the capacitor C2 to be controlled and the charge current generator G2. The switch N4 has a control terminal connected to the second output terminal $\overline{Q}$ of the flip-flop FF. It also includes a decoupling block DIS2 connected between the supply reference VDD and ground GND, said decoupling block DIS2 being further connected to the interconnection point XB and the second input terminal S of the flip-flop FF.

In particular, the decoupling block DIS2 includes a switch N2 and a control current generator G4, and is connected to the interconnection node XB.

The operation of the oscillator circuit 4 will now be described.

A start will be assumed with the switch N3 of the first stage A "open", and the switch N4 of the second stage B short-circuiting the capacitor C2.

In this initial condition of operation, the capacitor C1 of the first stage A is charged from the charge current generator G1 until its voltage attains the same value as the threshold voltage VTH of switch N1.

Upon attaining this value, the switch N1 changes over (turns on) and causes the flip-flop FF to change its state. The capacitor C1 is then shorted through the switch N3, and the capacitor C2 begins to be charged.

At the end of the capacitor C2 charging, the above conditions are replicated in a dual manner, and the situation is restored to the aforementioned initial condition. It can be shown that the oscillator circuit 4, as soon as turned on, enters either of the two conditions of operation considered (either C1 or C2 being charged).

The frequency of oscillation of the oscillator circuit 4 is given as:

$$f_0 = \frac{I_0}{2V_{GS} \cdot C_0} \tag{4}$$

where, $I_0$ is the value of the currents I1 and I2 being generated by the generators G1 and G2 (I1=I2);

$V_{GS}$ is the gate-source voltage of the switches N1 and N2, as biased to the current $I_0$; and $C_0$ is the capacitance of the capacitors C1 and C2, assumed to be identical.

The oscillator circuit 4 has, therefore, a frequency of oscillation which is unrelated to the supply voltage, the process parameters, and temperature, and is capable of operating with low supply voltages.

Figure 5:
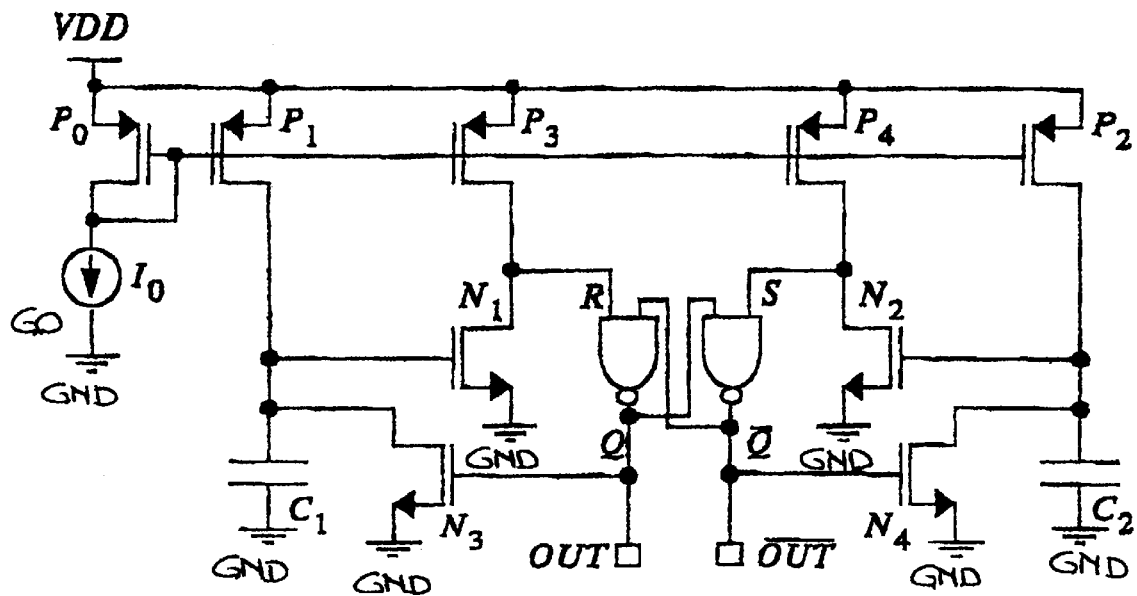
FIG. 5 is a more detailed schematic of the oscillator circuit of FIG. 4.

In fact, the oscillator circuit 4 of FIG. 4 can be implemented by P-type and N-type MOS transistors, to produce the circuit embodiment shown in FIG. 5.

In particular, the current generators G1, G2, G3 and G4 are formed of a distributed current mirror which includes first P1, second P2, third P3 and fourth P4 MOS transistors of the P type, having respective source terminals connected to the supply reference VDD, and having their gate terminals jointly connected to the gate terminal of a further MOS transistor P0 of the P type which is diode connected between the voltage reference VDD and, through a bias current generator G0, to ground GND.

In addition, the switches N1, N2, N3 and N4 comprise N-type MOS transistors having their source terminals connected to ground GND.

The embodiment of FIG. 5 is but one of the embodiment possible of the oscillator circuit 4 of FIG. 4. For example, a dual arrangement, wherein the capacitors C1 and C2 would be charged from beneath, is conceivable, with N-channel transistors in place of the P-channel MOS transistors.

Furthermore, circuits incorporating the invention could be modified to suit the application for which the oscillator circuit is ultimately intended.

For example, for low-consumption applications, the current generator G2 could be eliminated and a single generator G1 be switched alternately to charge the capacitors C1 and C2. It would be simple to provide a switching interface by using P-channel MOS transistors driven by the signals output from the first Q and second $\overline{Q}$ output terminals of the flip-flop FF, for instance.

On the other hand, for low electromagnetic interference applications, the switches N3 and N4 could be dimensioned to be highly resistive, thereby obtaining a triangular pattern of the voltage at the capacitors C1 and C2.

An oscillator circuit as herein described can be used to vary the duty cycle as desired by suitably dimensioning the currents I1 and I2 from the current generators G1 and G2, or the dimensions of the capacitors C1 and C2.

A suitable oscillator circuit for high frequencies could also be formed using CMOS transistors throughout.

Figure 6:
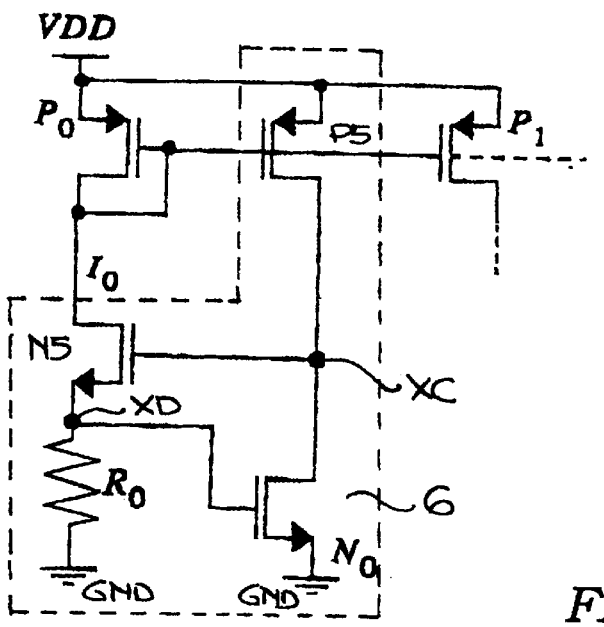
FIG. 6 is a detailed schematic diagram of a portion of the oscillator circuit of FIG. 5.

Additionally, the oscillation frequency of the oscillator circuit 4 could be made independent of the threshold value $V_{TH}$ of the MOS transistors used in its construction and made to depend on a resistive value, for instance by substituting the circuit configuration 6 shown in FIG. 6 for the generator G0.

In particular, this circuit configuration 6 includes a transistor N5 and a resistive element R0, connected in series with each other between the transistor P0 and ground GND. The circuit 6 also includes a P-channel MOS transistor P5 connected in a current mirror configuration with the transistor P0 between the supply reference VDD and, through a further N-channel MOS transistor N0, to ground GND.

The transistor N5 has a control terminal connected to an interconnection node XC between the transistors P5 and N0, while the transistor N0 has its control terminal connected to an interconnection terminal XD between the transistor N5 and the resistive element R0.

The current I0 flowing through the transistor N5 and the resistor R0, therefore, is given as:

$$I_0 = \frac{V_{GS}}{R_0} \tag{5}$$

where, $V_{GS}$ is the gate-source voltage of transistor N0 biased by the current I0 via the connection to the interconnection node XD.

If the transistors N0, N1 and N2 are suitably dimensioned and properly coupled to one another, the current value I9 given by (5) above can be substituted in (4) above to give the following oscillation frequency for that oscillator circuit:

$$f_0 = \frac{1}{2R_0 \cdot C_0} \tag{6}$$

To summarize, oscillator circuits according to embodiments of this invention have the following advantages:

they can be operated at the lowest working voltage of the MOS transistors used in their construction;

they have a frequency of oscillation which does not depend on the value of the supply voltage;

they have a duty cycle which can be varied as desired;

they represents a highly flexible solution, since their oscillation frequency can be made to depend on a current or a resistor;

they can operate at high frequencies, if comprised of CMOS transistors throughout;

their electromagnetic interference can be minimized.

Thus, a relaxation oscillator circuit has substantially been described which can be constructed of CMOS transistors with BCD5 technology, can operate on a low supply voltage (the lowest operating voltage of a MOS transistor) at a frequency of oscillation which is independent of the supply voltage, and has a duty cycle that can be modified at will.

The solution proposed for the oscillator circuit 4 has been tested by the Applicant, using available CMOS transistors with BCD5 technology, channel of 0.8 µm and threshold voltage of 0.9V.

Further, the oscillator circuit thus obtained was dimensioned for an oscillation frequency of 500 kHz at 5V.

For this circuit, a frequency variation of 0.6% per Volt within a voltage range of 5V to 2V, and a dependence on temperature of 0.1% per ° C. within a temperature range of −25° to 125° C., were measured.

A circuit having such features can be used to advantage, for example, for driving two (negative and positive) charge pumps in a DC-DC step-up converter operated at a 950 mV minimum supply voltage.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A low supply voltage oscillator circuit comprising:
 a first capacitor and a second capacitor to be controlled, each connected between first and second voltage references; and
 a circuit for charging and discharging said capacitors to be controlled, including:
  at least first and second stages having symmetrical structures in a mirror-image configuration and being connected between the first voltage reference and the second voltage reference;
  a memory element that connects the first and second stages together and has first and second inputs;
  first and second primary switches for alternately charging in a controlled fashion said capacitors, the first and second primary switches being connected respectively to the first and second capacitors at first and second connection nodes, respectively; and
  first and second secondary switches coupled respectively between the second voltage reference and the first and second inputs of the memory element, the first secondary switch having a control terminal coupled to the first connection node, and the second secondary switch having a control terminal coupled to the second connection node.

2. The low supply voltage oscillator circuit according to claim 1 wherein said memory element is a flip-flop having a first input terminal connected to said first stage, a second input terminal connected to said second stage, a first output terminal connected to a first output terminal of the oscillator circuit, and a second output terminal connected to a second output terminal of the oscillator circuit.

3. The low supply voltage oscillator circuit according to claim 2 wherein the circuit for charging and discharging includes a controlled supply circuit for said capacitors to be controlled, the controlled supply circuit including at least one current generating circuit and the first and second primary switches have respective control terminals coupled respectively to the first and second output terminals of the flip-flop.

4. The low supply voltage oscillator circuit according to claim 3 wherein said controlled supply circuit comprises first and second charge current generating circuits connected, in series with said first and second capacitors, respectively, between the first voltage reference and the second voltage reference.

5. The low supply voltage oscillator circuit according to claim 1, wherein said circuit for charging and discharging further includes first and second control current generating circuits respectively connected in series with the first and second secondary switches between the first voltage reference and the second voltage reference.

6. The low supply voltage oscillator circuit according to claim 1 wherein said circuit for charging and discharging includes a distributed current mirror comprising first, second, third, and fourth MOS transistors having respective source terminals connected to the first voltage reference and gate terminals jointly connected to a gate terminal of a fifth MOS transistor, which is diode connected between the first voltage reference and, through a bias current generator, the second voltage reference.

7. The low supply voltage oscillator circuit according to claim 6 wherein the base current generator comprises a first transistor and a resistive element connected in series with each other between the fifth MOS transistor and the second voltage reference, and a sixth MOS transistor connected in a current mirror configuration with the fifth MOS transistor between the first voltage reference and, through a seventh MOS transistor, the second voltage reference, thereby making the frequency of oscillation of the oscillator circuit independent of the threshold value $V_{TH}$ of the MOS transistors entering its construction and dependent on the resistance of the resistive element.

8. The low supply voltage oscillator circuit according to claim 7 wherein said first transistor has a control terminal connected to an interconnection node between said sixth and seventh MOS transistors, the seventh MOS transistor having a control terminal connected to an interconnection node between the first transistor and the resistive element.

9. The low supply voltage oscillator circuit according to claim 5 wherein said primary and secondary switches comprise MOS transistors having source terminals connected to the second voltage reference.

10. The low supply voltage oscillator circuit according to claim 1, wherein said primary switches are resistive, so that a voltage pattern of triangular shape may be obtained at the capacitors to be controlled, particularly for low electromagnetic interference applications.

11. A low supply voltage oscillator circuit, comprising:
 a first capacitor connected between first and second voltage references;
 a first primary switch coupled to the first capacitor and structured to discharge a charge stored in the first capacitor when a control terminal of the first primary switch receives a first control signal;
 a memory element having a first input and a first output coupled to the control terminal of the first primary switch, the memory element being structured to generate the first control signal at the first output based on a state at the first input; and
 a current mirror circuit that includes:
  a current generator;
  a first mirror transistor connected with the current generator between the first and second voltage references;
  a second mirror transistor connected with the first capacitor between the first and second voltage references and having a control terminal connected to a control terminal of the first mirror transistor; and
  a third mirror transistor connected between the first voltage reference and the first input of the memory element and having a control terminal connected to the control terminal of the first mirror transistor.

12. The oscillator circuit of claim 11, further comprising a secondary switch coupled between the first input of the memory element and the second voltage reference, the secondary switch having a control terminal coupled to an interconnection node between the second mirror transistor and the first capacitor.

13. The oscillator circuit of claim 11 wherein the memory element includes a second output that supplies a second control signal, the oscillator circuit further comprising:

a second capacitor connected between the first and second voltage references;

a second primary switch coupled to the second capacitor and structured to discharge a charge stored in the second capacitor when a control terminal of the second primary switch receives the second control signal.

14. The oscillator circuit of claim 13 wherein the current mirror circuit includes a fourth mirror transistor connected between the first voltage reference and a second input of the memory element and having a control terminal connected to the control terminal of the first mirror transistor.

15. The oscillator circuit of claim 14 wherein the current mirror circuit includes a fifth mirror transistor coupled with the second capacitor between the first and second voltage references and having a control terminal connected to the control terminal of the first mirror transistor.

16. The oscillator circuit of claim 11 wherein the current generator includes:

a first transistor and a resistive element connected in series between the first mirror transistor and the second voltage reference;

a fourth mirror transistor connected in a current mirror configuration with the first mirror transistor; and a second transistor connected with the fourth mirror transistor between the first and second voltage references.

17. The oscillator circuit of claim 16 wherein the first transistor has a control terminal connected to an interconnection node between the fourth mirror transistor and the second transistor, the second transistor having a control terminal connected to an interconnection node between the first transistor and the resistive element.

* * * * *